United States Patent [19]
Aubert

[11] Patent Number: 5,028,903
[45] Date of Patent: Jul. 2, 1991

[54] SPHERICAL PERMANENT MAGNET WITH EQUATORIAL ACCESS

[75] Inventor: Guy Aubert, Grenoble, France

[73] Assignee: Centre National de la Recherche Scientifique, Paris, France

[21] Appl. No.: 353,675

[22] PCT Filed: Oct. 13, 1987

[86] PCT No.: PCT/FR87/00394
§ 371 Date: Apr. 14, 1989
§ 102(e) Date: Apr. 14, 1989

[87] PCT Pub. No.: WO88/02924
PCT Pub. Date: Apr. 21, 1988

[30] Foreign Application Priority Data
Oct. 17, 1986 [FR] France ............................. 86 14419

[51] Int. Cl.⁵ .............................................. H01F 7/02
[52] U.S. Cl. .................................... 335/306; 324/318
[58] Field of Search ............... 335/302, 306; 324/318, 324/319, 320

[56] References Cited

U.S. PATENT DOCUMENTS 3,237,059 2/1966 Meyerer .
4,538,130 8/1985 Gluckstern et al. ................ 335/306
4,614,930 9/1986 Hickey et al. .................. 335/306 X
4,658,228 4/1987 Leupold .
4,692,732 9/1987 Leupold et al. .
4,701,737 10/1987 Leupold .
4,706,059 11/1987 Schwab .
4,707,663 11/1987 Winkoff et al. .

FOREIGN PATENT DOCUMENTS 218120 9/1986 Japan .................................... 335/306
747409 4/1956 United Kingdom ................ 335/306

Primary Examiner—George Harris
Attorney, Agent, or Firm—Oblon, Spivak, McClelland, Maier & Neustadt

[57] ABSTRACT

A substantially spherical magnet comprising two facing hemispherical, magnetized and hollow structures is proposed to produce a uniform induction field going from one structure to the other. By spacing sufficiently apart both structures, an equatorial opening is created to provide for the introduction of bodies to be subjected to said induction. It was shown that homogeneity may be reached at a given order if each structure is comprised of rings, shaped like a portion of a spherical crown, obtained by juxtaposition of magnetic blocks, and if the number of blocks in each ring is higher than or equal to four times the number of rings in each structure.

15 Claims, 4 Drawing Sheets

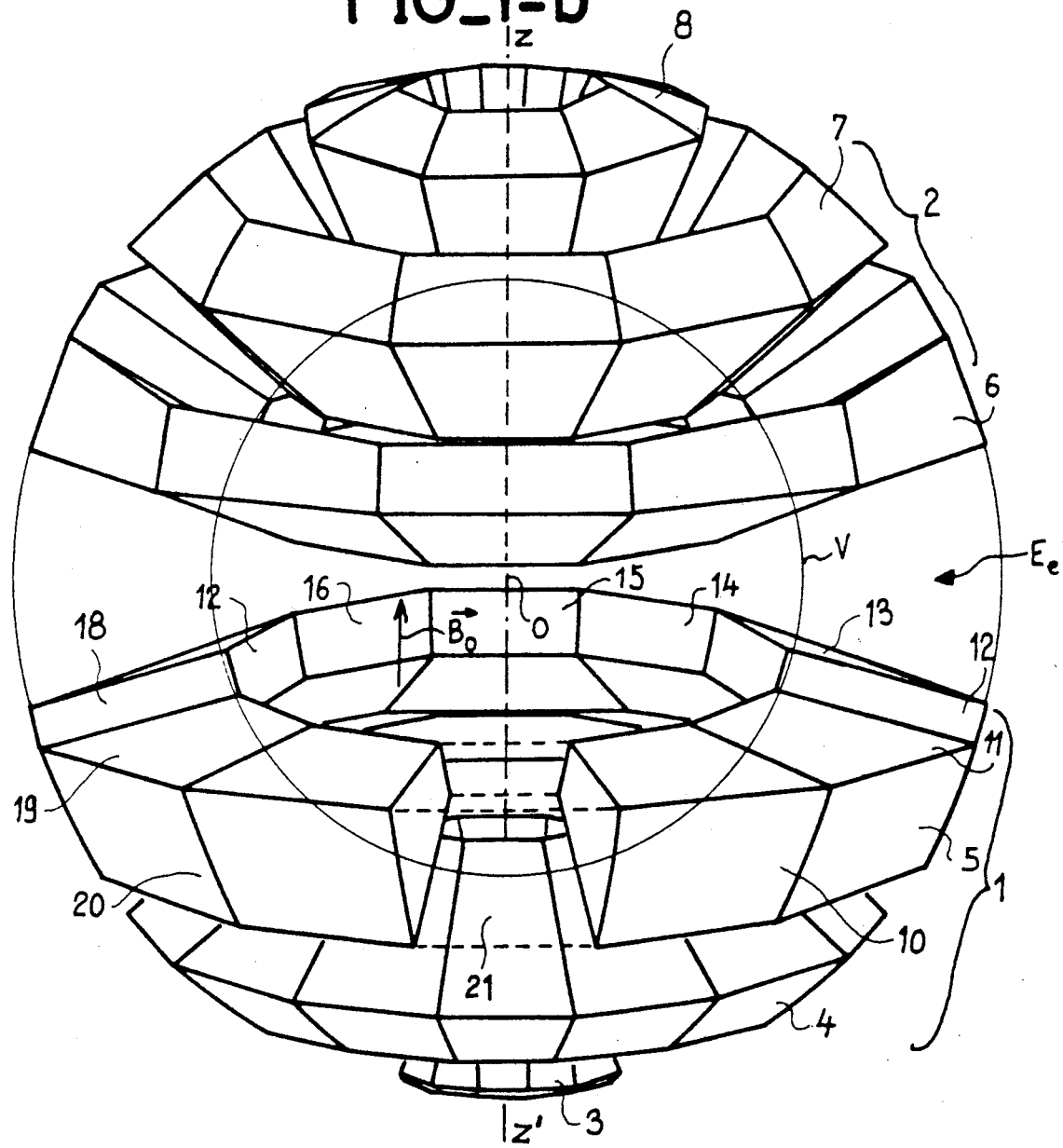
FIG_1-b
FIG_1-a

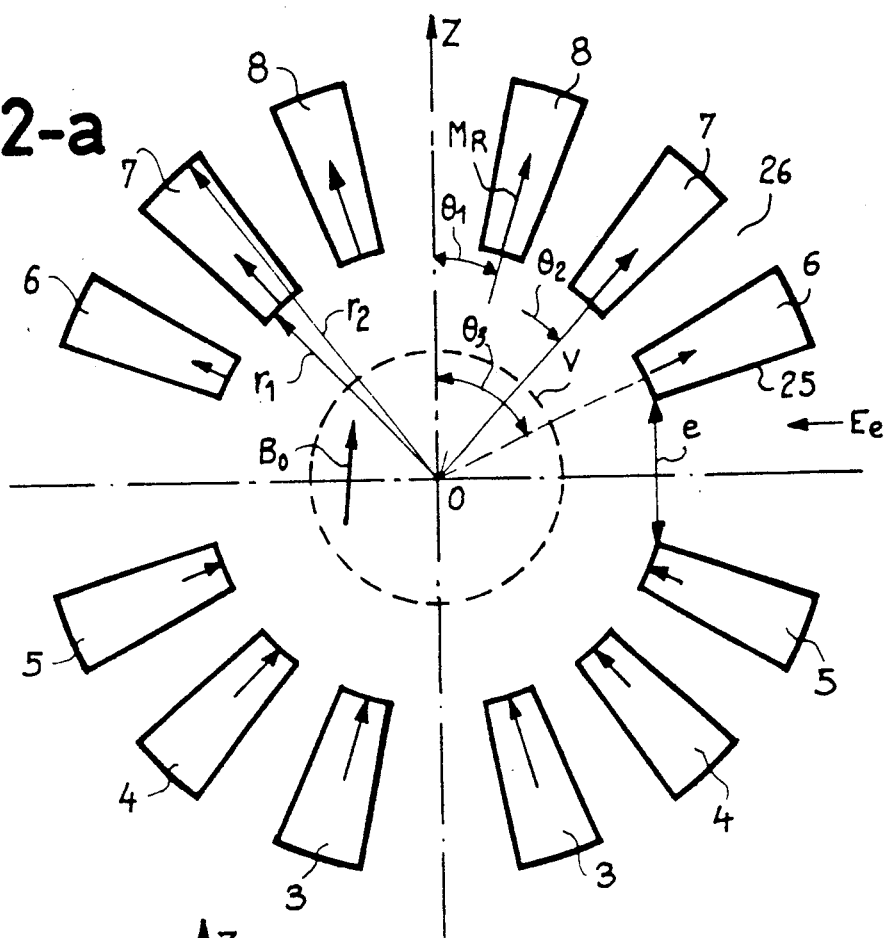
FIG_2-a
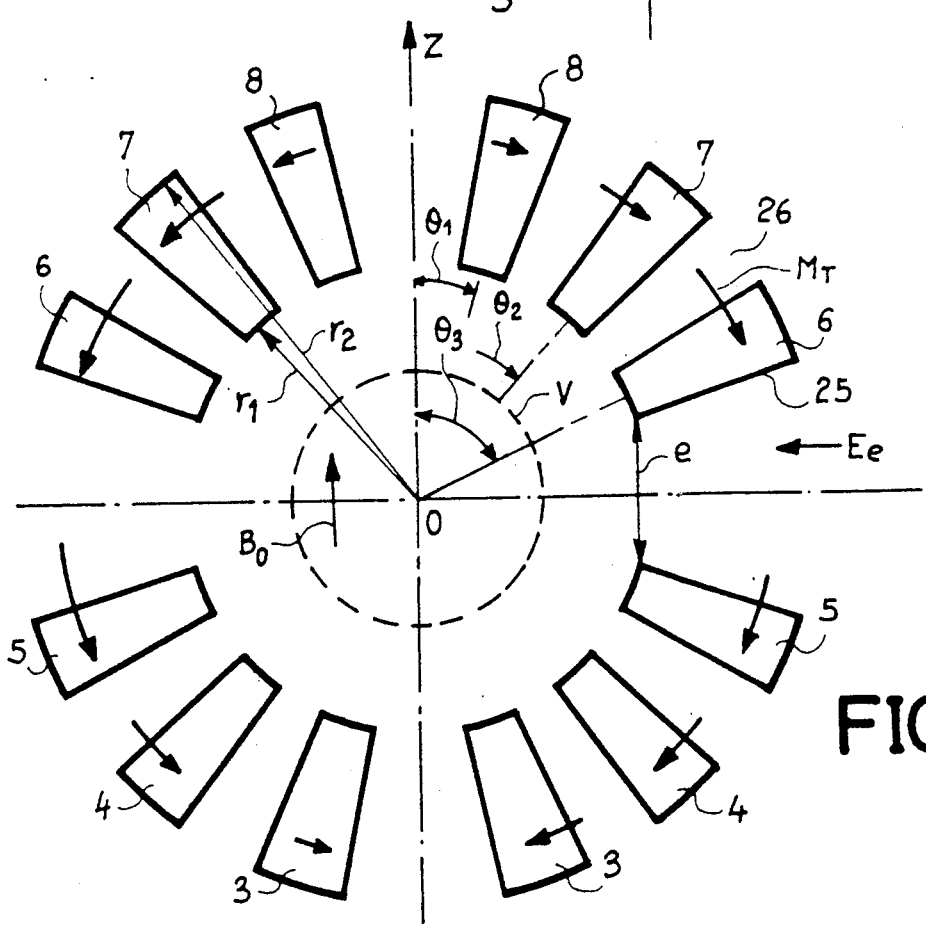
FIG_2-b

FIG_2-c
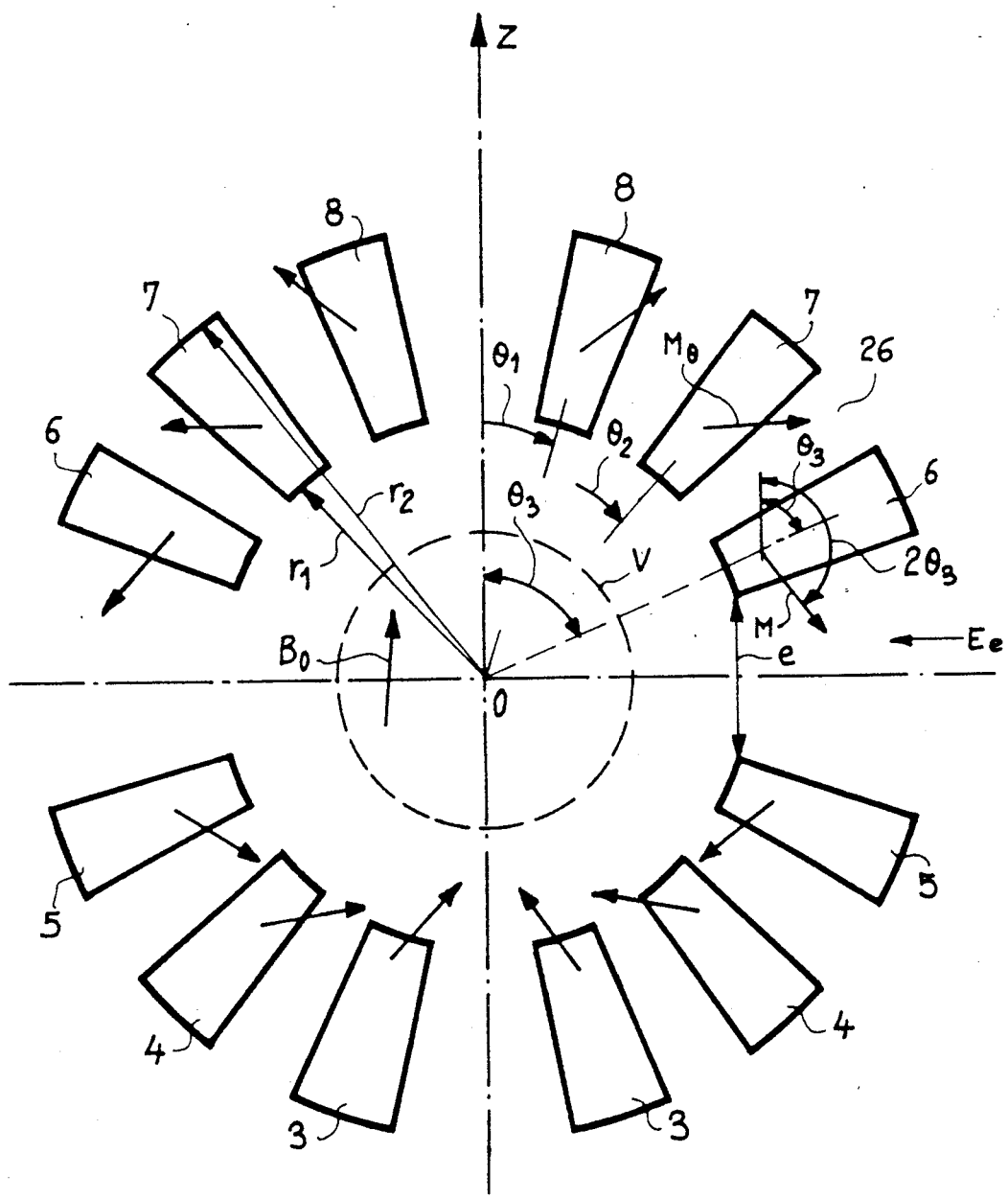

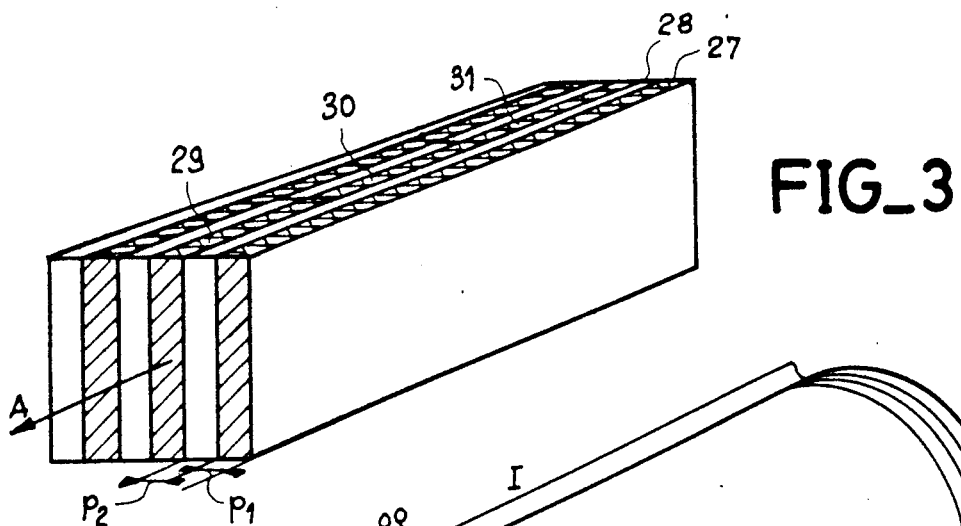
FIG_3
FIG_4
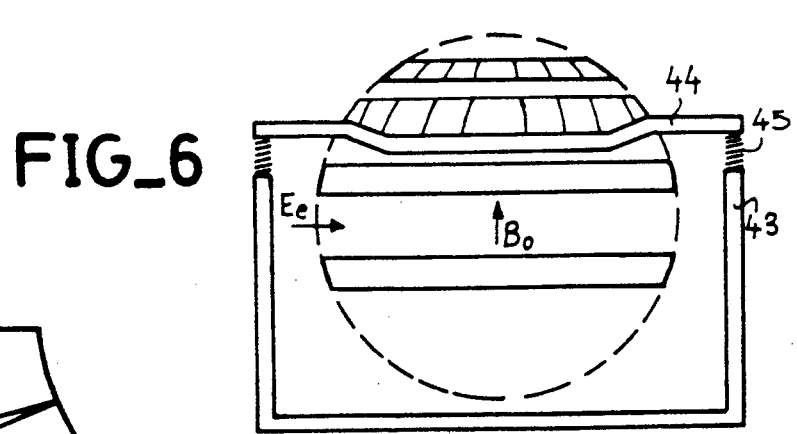
FIG_6
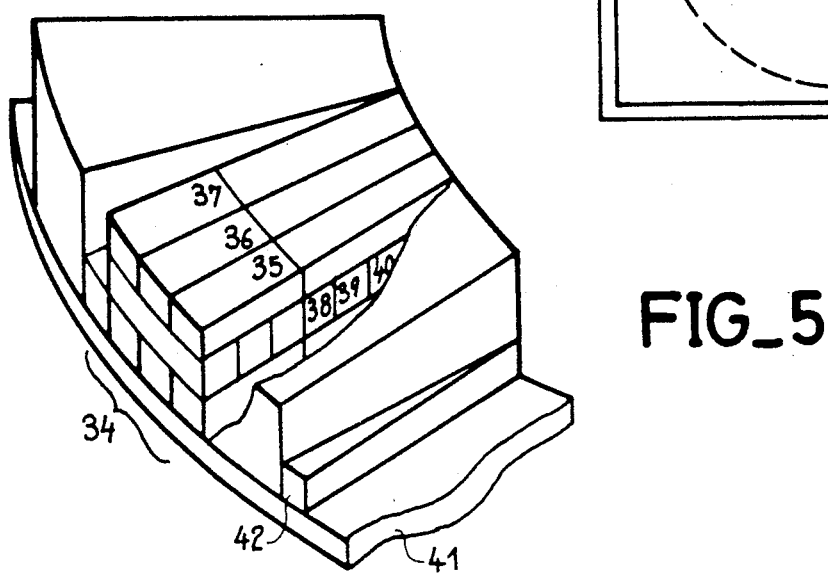
FIG_5

SPHERICAL PERMANENT MAGNET WITH EQUATORIAL ACCESS

BACKGROUND OF THE INVENTION

The present invention is due to Mr. Guy AUBERT, Director of the Service National des Champs Intenses, and its object is a magnet, of a generally substantially spherical shape, with equatorial access, to produce a uniform induction field. It finds application particularly in the medical field where magnets are used in experiments of imaging by nuclear magnetic resonance. It can also find application in all fields where such magnetic induction fields are required.

2. Discussion of the Background

In the field of imaging by magnetic resonance, it is necessary to place the objects to be imaged, the patients in medical field, in a high magnetic induction field (usually of 0.1 to 1.5 Tesla) which is homogenous and uniform (with a few parts per million of variation) in a large volume of interest (commonly a sphere of 50 cm diameter). Several classes of magnetic field generators have been developed until now. The main ones are: superconductive magnets, so-called resistive magnets and permanent magnets. Permanent magnets have many advantages. In particular, they require no energy supply to produce the field. They therefore do not run the risk of drift in their field value due to a drift of their supply, or possibly of the system for discharging the dissipated heat. They therefore call for no cooling means, in particular with sophisticated regulation techniques for the flow of cryogenic fluids. Their working temperature is easily stabilized. They are furthermore particularly suited to the making of structures or systems producing a transversal main field, namely a field perpendicular to a direction in which objects, patients, are introduced into the magnet. This arrangement is highly favorable to the making of receiver antennas of highly uniform and high gain resonance signals. A major drawback of permanent magnets is located, however, at the level of their industrial-scale manufacture.

Permanent magnet structures producing a transversal, uniform magnetic field in a relatively big volume have been described in the state of the art. In particular, in an international patent application No. WO 84/01226 filed on 23rd Sept. 1983 and published on 29th Mar. 1984, D. LEE et al. have described a magnet of this type. In it, a cylindrical structure (theoretically of infinite length) is approximated by a stacking of a certain number of annular sections each provided with a certain number of magnetized blocks. The blocks are distributed on the rim of the rings in a polygonal architecture which reproduces, as far as possible, the circular appearance of a theoretical cylinder. To produce a field transversal to the axis of the cylinder, the magnetization in each of the blocks is constant as regards modulus and is oriented, with respect to the direction of the induction field to be produced, with an angle equal to or twice that measured by the positioning angle of the block in question. The blocks described are, in a preferred way, prismatic volumes with a trapezoidal section.

The result of the distribution of magnetization thus proposed is that the magnetization of certain blocks has to be oriented, with respect to this block, in a direction which is parallel with none of the sides of the trapezoidal section. The making of magnetic blocks of this type therefore necessitates the use, industrially, of special magnetizers. While this use, albeit costlier than the use of standard magnetizers, is still possible, the same is not the case for the forming of the blocks. In effect, the distribution of the magnetization imposed in the cylinder creates a demagnetizing excitation, the orientation of which is rarely parallel, in each block, to that of the magnetization. This implies, for the fabrication, the choice of so-called anisotropic magnetic materials. Now, anisotropic magnetic materials which, besides, have the best magnetic properties, have the drawback of being hard to machine in directions that are oblique with respect to the direction of their anisotropy. The above-mentioned patent application indicates, especially in its FIG. 5 and in the associated text, that the making of the blocks can be obtained by a stacking of elementary bricks. However, it is clear that elementary bricks, of parallelepiped shape, have a favored direction of magnetization which is parallel to one side of the parallelepiped. Hence the fact remains that it is difficult, on the one hand, to cut the bricks obliquely with respect to the sides of this parallelepiped or, on the other hand, to efficiently magnetize the blocks formed in directions that are oblique with respect to the sides of these parallelepipeds. Consequently, in the structure presented, certain blocks, those in the alignment of the bisectors of the four quadrants, cannot easily be magnetized. The distribution of the magnetization in this magnet further leads to a corresponding distribution of the demagnetizing excitation. This is such therein that, at places, it may be sufficient to substantially diminish the magnetization. Consequently, the theoretically calculated magnet cannot be made and the performances of the real magnet are quite removed from the ideal.

A magnet of this type further has other drawbacks. In particular, there is no equipment entrance possible into the interior of the zone of interest apart from the axial entrance. Finally, above all, cylindrical magnets present a drawback related to the cyldrical shape itself. With a cylindrical shape, it is necessary for the magnetic blocks located at the ends of a cylinder to be big since, in brief, they represent and replace the extension to infinity of the two ends of the cylinder. Now, in view of their distance, they contribute with little efficiency to the intensity of the induced field: they have, above all, the effect of improving its homogeneity. Their high mass and, therefore, their weight related to the problems of the cost of the magnetic materials is a brake on the use of permanent magnets.

SUMMARY OF THE INVENTION

The invention has, as an object, the overcoming of the above-mentioned drawbacks and, to this end, it concerns a magnet characterized in that it is substantially spherical and in that it comprises two hollow facing structures, of a generally hemispherical shape, magnetized so as to produce an induction field that goes from one to the other in their internal volume, and sufficiently separated from one another to create an equatorial opening and to enable the introduction, in this volume, of bodies to be subjected to this induction.

The invention shall be better understood from the reading of the following description and from the examination of the figures that accompany it. These figures are given purely by way of indication and in no way restrict the scope of the invention. The figures show:

BRIEF DESCRIPTION OF THE DRAWINGS

FIGS. 1a and 1b views in perspective of the spherical magnet of the invention;

FIGS. 2a to 2c diametral sections of magnets according to the invention;

FIGS. 3 to 6: steps in the assembly of blocks made of magnetic material to obtain a magnet in accordance with that of FIG. 1.

DESCRIPTION OF THE PREFERRED EMBODIMENTS

FIGS. 1a and 1b represent, schematically and in perspective, a magnet in accordance with the invention. The magnet shown is spherical with a center 0. It comprises two hollow facing structures, respectively 1 and 2. The two structures have a generally hemispherical shape. The structure 1 of figure 1a and the structure 2 of figure 1b are seen in perspective from the front, slightly above the base of the hemisphere, and partially reveal the hollow internal volume V. In the invention, each structure is magnetized radially and/or tangentially or, again, with a rotating magnetization so as to produce an induction field $B_O$ going from one to the other: here, from the structure I to the structure 2. The corresponding magnetizations appear respectively in FIGS. 2a and 2c which are sections of the sphere along a plane passing through an axis z'Oz. The two structures are separated from one another by an equatorial opening $E_e$, the dimension e of which is sufficient to enable the introduction, in the volume V of examination, of bodies to be subjected to induction. In a preferred way, the magnet comprises, to form the structures, a certain number of rings, for example numbered 3 to 8. Each ring is shaped like a portion of a spherical crown. Each ring is preferably formed by a certain number of magnetized blocks placed side by side, for example the twelve blocks numbered 10 to 21 of the ring 5.

According to an essential characteristic of the invention, all the magnetized blocks have the particular feature wherein their magnetization M is either radial ($M_R$ for the structure of FIG. 2a) or tangential ($M_T$ for the structure of the FIG. 2b) to the sphere with center 0 or, finally, rotating, i.e. that the direction of the magnetization makes, in each block, an angle (with the perpendicular to the equatorial opening), the value of which is twice that of the positioning angle of this block ($M_\Theta$ in FIG. 2c). The result thereof in the first two solutions is that the fabrication and the magnetization of the magnetized blocks may be thereby facilitated. In effect, these blocks arranged tangentially to the volume of interest of the magnet in the first two solutions always have directions of construction that are tangential (and, automatically radial) to the sphere. For these two solutions, it has been discovered that a uniform and homogeneous transversal field could be obtained with radial and/or tangential magnetizations if, in each block, the modulus of the magnetization varies, as the case may be, as the cosine or as the sine of the positioning angle $\Theta$ of the block with respect to an axis z'Oz of the sphere orthogonal to the plane of the equatorial opening $E_e$. With the rotating magnetization, the modulus of M is constant, but the direction is variable from one block to another. The solution with rotating magnetization is therefore more difficult to fabricate. However, it is at its most efficient as regards the mass of magnetic material needed. The reduction of volume and of mass needed to produce the desired field is due, in all three solutions, to the very shape of the magnet and to the choice of an entrance by an equatorial opening.

In a preferred way, the structures 1 and 2 are symmetrical with one another. They therefore comprise one and the same number of rings, and, in an also preferred way, in each ring, one and the same number of blocks. In particular, the ring 8 comprises the same number of blocks as the ring 3. This constraint cannot, however, be totally justified and, for reasons of industrial-scale manufacture, it may be warranted to choose a number of blocks, in the rings located near spherical domes (3 and 8), different from that one chosen for the equatorial rings (5 and 6): the equatorial rings may have more blocks. It shall be seen further below that reasons of simplification as well as reasons of optimum performance lead to the preferred solution and, in this preferred solution, to a particular number of blocks in the rings depending on the number of rings in each structure or in the magnet. Furthermore, the calculation of the magnets shows that the rings may be disjoined from one another. This facilitates their assembly and enables, besides, the making of equipment entrances. In particular, the summit rings may be hollow. It is then easily possible to make all the connections with the different pieces of equipment, of an apparatus for imaging by NMR, which are introduced in the volume V.

In a first configuration, FIG. 2a, the direction of the magnetization is always radial. In this case, the value of the magnetization is proportionate to the cosine of the positioning angle $\Theta$ of the block. This means that, in each block of one and the same ring, the magnetization is the same. This also means that the radial magnetization is strongest in the rings close to the hemispherical domes (3 and 8) and weakest in the equatorial rings (5 and 6). In the low part of the figure, the directions of magnetization of the different blocks have a radial form which is convergent towards the center 0. To this low part where the magnetization is convergent, there corresponds a high part with divergent magnetization. The result thereof is that, at the equatorial opening, the induction $B_O$ has the indicated direction. This structure has the advantage of reducing the cost of the magnet: there is little of magnetic materials used.

In a structure which is a counterpart of the preceding one (shown in FIG. 2b) the magnetization is tangential to the sphere. The orientation of this magnetization is substantially from top to bottom so as to produce a same field $B_O$ as in the radial embodiment. The value of this magnetization is proportionate to the sine of the positioning angle of the blocks: $\Theta$, $\Theta_2$, $\Theta_3$. The field lines of the magnetization follow the trigonometrical direction on the left-hand side of the figure and the reverse trigonometrical direction on the right-hand side. The magnetization is nominal in modulus in the magnetic blocks of the rings 5 and 6 or it is minimal in the blocks closest to the axis z'z. This approach therefore leads to a mass of material which is greater for the same field $B_O$ than the preceding solution. In the same way, it is also more costly in magnetic material than the solution with rotating magnetization of FIG. 2c. The latter, where the magnetization is constant as regards modulus, further has the drawback wherein the fabrication is less rational: the blocks of all the rings have different magnetizations whereas in each of the first solutions there are only three types of magnetized blocks.

In the preferred embodiments, shown in FIG. 2a, 2b and 2c, the cosines of the angles marking the inclination of the radial faces, such as 25 and 26 with respect to the axis z'z of the portions of spherical crowns forming the rings have (in a three-ring variant) the following values: 0.98; 0.91; 0.81; 0.67; 0.49 for the face 26 and 0.30 for the face 25.

It is possible to achieve one of the three solutions at choice. However, all the magnets, including the permanent magnets, should preferably have a null dipole moment. If this is not so, it becomes difficult to approach a control desk, provided with a display panel with a cathode ray tube screen, in the immediate environment of the magnet. It is well known that the indications displayed on this screen are distorted owing to the existence of the external magnetic field of the magnet. This, moreover, prohibits the use of color display panels. To counter this problem, the control desk should be far away from the magnet. An operator directing an NMR experiment is, therefore, obligatorily far from the patient who undergoes a examination such as this. This is rather harmful to the psychological comfort of this patient. It is furthermore noted that practitioners who possess cardiac assistance machines, sensitive to the spurious induction fields, cannot perform NMR experiments. In order to create a null, external spurious field (it is said that the magnet has a null total dipole moment), it is preferred to combine the first two structures together. The third solution is already at null total dipole moment by its design. But it is difficult to achieve.

To combine the first two configurations, it is possible to make these two structures concentrically with one another, one being with radial magnetization, the other being with tangential magnetization. In a preferred way, it is also possible to make rings comprising $n_1$ blocks with radial magnetization (in cosine) and $n_2$ blocks with tangential magnetization (in sine). The null dipole moment is obtained for $n_1$ equal to $2n_2$. For reasons of homogeneity seen further below, the number of blocks in each ring is a multiple by 4 of number of rings in each structure. We are then led to make, for each elementary block, three sub-blocks: two with radial magnetization and one with tangential magnetization. In this case, therefore, there are 24 radial sub-blocks and 12 tangential sub-blocks. For reasons of homogeneity, they are symmetrically and evenly distributed in each ring.

In a preferred way, which is more economical in terms of the mass of material needed to make a given field $B_O$, a variegated structure, which is described further below, is made. It has been discovered that a variegated solution requires each solution to take part in the variegation with magnetizations in each ring respectively proportionate to $a_1 \cos \Theta$ and to $a_2 \sin \Theta$ times a nominal magnetization common to both solutions. In this case, $a_1$ and $a_2$ should be such that $(a_1)^2 + (a_2)^2$ is smaller than or equal to 1. Furthermore, the null dipole moment is obtained, in this case, when $a_1$ is equal to $a_2$. The resolution of these two equations indicates that, in taking proportions $a_1$ and $a_2$ equal to $2/\sqrt{5}$ and $b1/\sqrt{5}$, we obtain the maximum intensity of the induction field compatible with a null dipole moment. If, for each of the two solutions, we choose the same materials, capable therefore of having one and the same nominal magnetization, we are led to an additional consumption in terms of mass of magnetized products, of the order of 20% as compared with the radial solution.

It is possible to give an analytic expression of the value of the field $B_O$ as a function of the coordinates of the location of the space V where this field prevails. In particular, the component of $B_O$ along the axis z'z can be expressed in a series of polynomial terms, as a function of the variables x, y, z and of increasing power. The coefficients which weight each of these terms may be assigned to an order equal to the power of the concerned term in x, y and z. It is known that the homogeneity of the field $B_O$ obtained is all the higher as these coefficients may be considered to be null upto an order which is the highest possible. It is said that a field is homogeneous to an order h, if all the polynomial terms of power smaller than or equal to h have a null coefficient. In the invention, it was realized that, for an given order h, there existed a minimum number of rings in each structure and a minimum number of blocks in each ring for which this homogeneity was achieved. This discovery applies to all three solutions. It was thus discovered that the number of rings $n_a$ had to be such that:

$$n_a \geq (h+1)/4$$

As for the number $n_b$ of blocks per ring, it should be such that:

$$n_b \geq (h+1).$$

This leads to the following conclusions. Firstly, the optimization advocated by the invention suggests a minimum structure, namely one where the number of blocks to be made is the smallest possible to obtain homogeneity to a given order. This minimum structure such that the number of blocks in a ring of a structure is equal to four times the number of rings in this structure. Secondly, the installation and setting of the rings may be as delicate as the fabrication of the blocks and the rings is relatively easy. Hence, in a preferred way, it is seen to it that the homogeneity sought is met with a minimum number of rings. On the other hand, it is possible to position a number of blocks greater than that necessary. Ultimately, the most practical industrial solution is such that the number of blocks per ring is greater than or equal to four times the number of rings per structure.

In fact, in the invention, it was realized that there was, furthermore, for a given homogeneity, an upper limit or ratio between the thickness e of the equatorial opening and the internal radius $r_1$ of the hollow structures. In view of the requirements of homogeneity proper to NMR experiments, it was discovered that an order of homogeneity 11 was desirable. Under these conditions, typically, the ratio $e/r_1$ should be limited to 0.6 otherwise the volume of material needed becomes prohibitive. The order of homogeneity 11 corresponds to the spherical magnet shown in FIGS. 1 and 2. It comprises three rings per structure $((11+1)/4)$ and twelve $(3 \times 4)$ blocks per ring. It is observed that the limit of this ratio $e/r_1$ gives the limit position of the equatorial rings 5 and 6: it is equal to twice the cosine of the positioning angle of the equatorial face of these rings. The justification of the existence of this limit can be explained thus. If h is imposed for the magnet, the minimum number $n_a$ of rings is defined. It is then necessary to place these rings in the remaining part of the hemisphere, once that which is attributed to the opening e has been removed. We then arrive at the intensity $B_O$ of the desired field by increasing the external radius $r_2$ of the sphere. From the instant when the opening is increased, at h given, the place for the magnetic material (in terms of angular sector) gets reduced. It should be compensated for by an increase in $r_2$. Now, the efficiency of the material, at the distance $r_2$ is small compared with the efficiency of the near parts of V. The need for magnetic material then increases asymptotically with $e/r_1$. The limit value of this ratio in the case when h equals 11, is substantially to 0.8. And, in this case, the magnetic mass necessary is infinite. This is why 0.6 is chosen.

The choice of the orientation of the magnetizations, radial or tangential, resolves, as referred to earlier, the problem of the magnetization of the blocks. In effect, the blocks are always magnetized according to their structural orientations (and not with any orientations with respect to these structural orientations). However, it is necessary to resolve the problem of the variation of the modulus of their magnetization according to the cosine or sine of the positioning angle $\Theta$ of the blocks with the axis $z'0\,z$. A first solution consists in the use, for all the blocks, of the nominal magnetization of the material in reducing the angular opening around $z'O\,z$ of each of the $n_b$ blocks forming a given ring, the eliminated magnet material being, for example, replaced by a material with a non-magnetic structure (epoxy resin or other). Thus, for the magnet with cosine variation of FIG. 2a, the $n_b$ blocks of the ring are assembled contiguously and have an angular opening around $z'\,0\,z$, $\Phi_1$ equal to $2\phi/n_b$, the blocks of the ring 7 have a reduced angular opening, namely $\Phi_2$ $(2\pi/n_b)$ $(\cos\Theta_2/\cos\Theta_1)$ and therefore leave regular angular intervals between them of a value $(2\pi/n_b)(1-(\cos\Theta_2/\cos\Theta_1))$, those of the ring 6 have an angular aperture $\Phi_3=(2\pi/n_b)(\cos\Theta_3/\cos\Theta_1)$, with non-magnetic intervals $(2\pi/n_b)(1-(\cos\Theta_3/\cos\Theta_1))$. For the sine structure of FIG. 2b, it will be the blocks of the ring 6 which will be contiguous with $\Phi_3=2\pi/n_b$ whereas, for the rings 7 and 8, there will be, respectively, $\Phi_2=(2\pi/n_b)$ $(\sin\Theta_2/\sin\Theta_3)$ and $\Phi_1=(2\pi/n_b)$ $(\sin\Theta_1/\sin\Theta_3)$ with the corresponding non-magnetic angular intervals. This method is clearly applicable to the making of a combined structure with a null dipole moment.

A second method can be used to obtain a magnetization of adjustable modulus further enabling the making of the variegated structure with a null dipole moment presented further above. FIGS. 3 to 5 show the different steps of this general method of construction of a magnet according to the invention. FIG. 3 shows that this result is achieved simply by attaching plates (bars could also be placed) made of magnetic materials 27 to plates 28 made of non-magnetic material. The proportion of the magnetic material with respect to the general volume is made to vary by bringing into play the thickness $p_1$ of the magnetic plates with respect to the thickness $P_2$ the non-magnetic plates. It can be easily shown that the macroscopically equivalent magnetization of a block thus made is equal to the product of the intrinsic magnetization of the parts made of magnetic materials by the proportion $(p_1/(p_1+p_2))$ of these magnetic materials in the whole. Failing the availability of plates 27 of adequate dimension, it is also possible to use slabs 29 to 31 of permanently magnetizable material, that are joined end to end with one another with a very fine contact, and in such a way that their direction of magnetic anisotropy A is aligned and continuous, on the one hand, with one another and, on the other hand, with the magnetization direction A subsequently imposed on the blocks.

The bricks formed by the stacking of the plates may be of standard dimension. They are calculated to be capable of being magnetized in a standard magnetizer such as the magnetizer 33 of FIG. 4. The current I which flows through th:/s magnetizer has to be strong enough, and produce sufficiently great excitation, for all the parts; made of magnetizable materials, of the brick to be brought to their saturation of magnetization. If this saturation magnetization is called $M_s$, the brick will be magnetized with a value macroscopically equal to the product of $M_s$ by the proportion of magnetic material.

Magnetized bricks, thus made of composite material, are then assembled to form the magnetized blocks described until now. In the solution using variegated magnetization, the blocks comprise, juxtaposed with one another, bricks magnetized orthogonally to one another. For example, a block 34 in FIG. 5 comprises radial magnetization bricks 35 to 37 that are juxtaposed with, or even stacked on, bricks 38 to 40 with tangential magnetization. Should the proportion of bricks in cosine with bricks in sine be not equal to I, supplementing with non-magnetic material is done. The assembling of the bricks in the blocks can be done in the same way as the assembling of the plates or of the slabs in the bricks: i.e. for example with epoxy resin based bonders. The blocks thus formed are then fixed to a crown 41 made of epoxy resin to form the rings. If it is chosen, in order to simplify the construction, to use parallelepiped-shaped blocks, wedge-shaped shims such as 42 are inserted to form the rings. In case of need, another crown (not shown) opposite the crown 41 may hold the blocks in a sandwich to ensure the rigidity of the ring.

In a preferred way, the crowns 41 are not plane but are convex so that they adapt to the spherical shape desired. The making of portions of spherical crowns forming the rings then necessitates the making of non-parallelepiped blocks. Bricks already comprising the right proportion of magnetic material are cut slantwise. This cut is made before the magnetization. During the mounting, the crowns (FIG. 6) can be maintained by pillars such as 43. To this end, the crowns are provided with brackets 44 which lie on the tops of the setting screws 45 which are solidly joined to pillars 43. In this way there is a simple means available making on-site corrections, at an industrial level, in the homogeneity of the constructed magnet.

In a preferred manner, the magnetic materials used are either ferrites of strontium or barium, or samarium-cobalt alloys or iron-neodymium-boron alloys. In effect, in a structure of this type, the demagnetizing excitation in the blocks is never colinear with the magnetization and it is consequently necessary to choose an anisotropic magnetic material. These different materials have intrinsic saturated remanent magnetizations. Besides, they are different in specific mass and price. It is possible to choose in this way, depending on the various specifications of the induction field to be produced, that solution which is most suitable. The calculation of the external radius of the sphere and, hence, of the dimension of the blocks is of the same type, in the case of the invention, as that leading to the determination of the dimensions of the block in the state of the art referred to. The external radius of the sphere $r_2$ is given by the value of the nominal magnetization and by the field of induction to be obtained. In practice, the magnet is determined in the following way. Knowing the application envisaged, the dimension of the opening e, the field $B_O$ to be obtained, the magnetic material, and h the homogeneity of the field are chosen. Therefrom $r_1$ ($r_1=e/0.6$ if $h=11$) and $r_2$ are deduced.

I claim:

1. A magnet characterized in that it is substantially spherical and in that it comprises two hollow (1, 2) facing structures, of a generally hemispherical shape, magnetized so as to produce an induction field ($B_O$) going from one to the other in their internal volume (V), and sufficiently separated (e) from each another to create an equatorial opening ($E_e$) and to enable the introduction, in this volume, of bodies to be subjected to this induction.

2. Magnet according to claim 1, characterized in that the structures are symmetrical with each another.

3. Magnet according to claim 1 or 2, characterized in that each structure comprises a certain number ($n_a$) of concentric rings, each formed by a certain number ($n_b$) of magnetic blocks, and determined by a revolution of the blocks around an axis (z'z) of a sphere perpendicular to the plane of the equatorial opening.

4. Magnet according to claim 3, characterized in that the magnetization in the rings is at least partially radial (FIG. 2a) and in that the modulus of this radial magnetization varies as the cosine of the angle ($\Theta$) of reference which links the direction of the induction to the azimuth of the ring.

5. Magnet according to claim 3, characterized in that the magnetization in the rings is at least partially tangential (FIG. 2b) and in that the modulus of this tangential magnetization varies as t e sine of the positioning angle ($\Theta_1$) which links the direction of the induction to the azimuth of the ring.

6. Magnet according to claim 3, characterized in that the magnetization in the rings makes an angle with the direction of induction equal to twice the positioning angle of the ring with respect to this same direction (FIG. 2c).

7. Magnet according to any one of the claims 1 or 2, characterized in that each structure comprises $n_a$ rings comprising $n_b$ of blocks of the same magnetization, the induction being homogeneous to an order of h if $n_a$ is at least equal to $(h+1)/4$ and if $n_b$ is at least equal to $(h+1)$.

8. Magnet according to claim 7, characterized in that $n_a$ is equal to three and in that $n_b$ is equal to twelve.

9. Magnet according to claim 3, characterized in that the blocks comprise .bricks with radial magnetization and bricks with tangential magnetization.

10. Magnet according to claim 9, characterized in that, in each block, the presence of the bricks with radial magnetization and bricks with tangential magnetization is respectively $1/\sqrt{5}$ and $2/\sqrt{5}$ to create a magnet with null external dipole moment.

11. Magnet according to claim 7, characterized in that $n_b \geq 4n_a$.

12. Magnet according to claim 3, characterized in that the hollow volume has an internal radius $r_1$ and the equatorial opening has a height e such that $e/r_1 \leq 0.6$.

13. Magnet according to claim 3, characterized in that blocks of the same magnetization of a ring are disjoined from one another in this ring, and are separated from one another by spaces which are a function of the value of the equivalent magnetization to be obtained in this ring.

14. Magnet according to claim 4 characterized in that in each ring the number of blocks with radial magnetization ($n_1$) is twice the number ($n_2$) of blocks with tangential magnetization.

15. Magnet according to claim 5, characterized in that in each ring the number of blocks with radial magnetization ($n_1$) is twice the number ($n_2$) of blocks with tangential magnetization.

* * * * *